(12) United States Patent
Leckel et al.

(10) Patent No.: US 6,404,798 B1
(45) Date of Patent: Jun. 11, 2002

(54) LOW NOISE AND WIDE POWER RANGE LASER SOURCE

(75) Inventors: Edgar Leckel, Jettingen; Emmerich Mueller, Aidlingen; Clemens Rueck, Bondorf, all of (DE)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/208,287

(22) Filed: Dec. 8, 1998

(30) Foreign Application Priority Data

Dec. 9, 1997 (EP) ............................................. 97121649
Sep. 25, 1998 (EP) ............................................. 98118238

(51) Int. Cl.$^7$ ............................ H01S 3/082; H01S 3/08
(52) U.S. Cl. ......................... 372/108; 372/97; 372/99; 372/102
(58) Field of Search ............................. 372/20, 97, 99, 372/102, 108, 98, 101

(56) References Cited

U.S. PATENT DOCUMENTS

| 4,864,578 A | | 9/1989 | Proffitt et al. | |
|---|---|---|---|---|
| 5,216,679 A | * | 6/1993 | Tamura et al. | 372/20 |
| 5,442,651 A | * | 8/1995 | Maeda | 372/97 |

FOREIGN PATENT DOCUMENTS

| EP | 0 702 438 A1 | | 3/1996 |
|---|---|---|---|
| JP | 63137493 | | 9/1988 |
| JP | 06140717 | | 5/1994 |
| JP | 06140717 A2 | * | 5/1994 |

OTHER PUBLICATIONS

L.L.Lewis, Low Noise for Optically Pumped Cesium Standards, 43rd Annual Symposium on Frequency Control 1989.*

"Oscillator Design Improves Dye–Laser Performance", Jeffrey Bernstein, et al, Laser Focus World, pp. 117–120, Sep. 1995.
"Optimised Fabry–Perot (AlGa) As Quantum–Well Lasers Tunable Over 105 NM", Electronics Letters, vol. 25, No. 2, pp. 143–145, Jan. 1989.
European Search Report, EP 97 12 1649, May 14, 1998.
IEE Journal of Quantum Electronics, vol. 29, No. 6, Jun. 1, 1993, pp. 1693–1700, Bouchoule, S. et al., "Highly attenuating External Cavity for Picosecond–Tunable Pulse Generation from Gain/Q–Switched Laser Diodes".
Proceedings of the 43rd Annual Frequency Control Symposium, May 31–Jun. 2, 1989, No. 89CH2690–6, pp 151–157, Lewis, L. L., "Low Noise Laser for Optically Pumped Cesium Standards".
Optics Communications, vol. 85, No. 4, Sep. 15, 1991, pp 355–359, (the whole document), Boshier, M. G., et al., "External–cavity frequency–stabilization of visible and infrared semiconductor lasers for high resolution spectroscopy".

* cited by examiner

Primary Examiner—Paul Ip
Assistant Examiner—Armando Rodriguez

(57) ABSTRACT

A laser source with an optical resonator includes a laser gain medium with a low reflective first facet emitting a laser beam within the optical resonator. A wavelength dependent mirror receives the laser beam and reflects back a wavelength separated laser beam. A beam splitter divides the wavelength separated laser beam into a feedback beam directed toward the laser gain medium and a first output beam to be coupled out of the optical resonator. As a first improvement, the laser gain medium includes a second facet which is partly reflective, so that the second facet emits a second output beam of the laser source. As a second improvement, the laser source further includes a mirror arranged in a way that a beam diffracted by the wavelength dependent mirror is reflected back and again diffracted by the wavelength dependent mirror, so that the twice diffracted beam provides the wavelength separated laser beam.

17 Claims, 4 Drawing Sheets

LOW NOISE AND WIDE POWER RANGE LASER SOURCE

FIELD OF THE INVENTION

The present invention generally relates to laser sources and further to equipments for measuring optical components.

BACKGROUND OF THE INVENTION

In optical communication networks, information is generally transmitted by optical fibers from a stimulus, e.g. a laser diode, to an optical receiver, e.g. a photo diode. These may not only be point-to-point links but may also provide a complex network structure which generates the need for optical components for data routing, adding, dropping and switching.

To increase the transmission capacity, several communication channels are normally used simultaneously. In principle, this can be realized by separating the channels by providing time multiplexing or centering channels at different wavelengths. The latter principle is also known as Wavelength-Division-Multiplexing (WDM) and is becoming increasingly important. A state of the art WDM system has about 20 channels separated by 0.8 nm in a wavelength range of around 1550 nm. First research work is already done to increase the amount of channels by reducing the channel spacing down to 0.2 nm and therefore increase the transmission capacity by about four times.

One of the problems by using WDM is the interference (cross talk) of the communication channels. To avoid interference, the used optical components need to exhibit a high wavelength dependent transmission characteristics, that is, e.g., a WDM cross-connect switch with a transmission dynamic of up to 30 dB over tenths of a nanometer. A known complex and expensive measurement setup for characterizing this kind of optical components is based on a tunable laser source, a wavelength meter, a tracking filter and an optical power meter (cf., e.g., in AFiber optic test and measurement@ by Dennis Derickson, ISBN 0-13-53480-5, page 358 ff.).

In general, the signal to total noise ratio of a laser source (e.g. a tunable laser source as depicted in the above mentioned book by Dennis Derickson on page 360) limits its applications where high transmission dynamics characteristics have to be measured, e.g., in case of a notch-filter with a high signal suppression, such as a fiber grating, where the back noise (SSE, ASE) of the laser source determines the measured suppression of a signal positioned at a center wavelength of the filter (cf. FIG. 6).

A solution to improve the signal-to-noise ratio of a laser system is to provide a filter in combination with a broadband receiver or an optical spectrum analyzer. To ensure also the wavelength accuracy of the measurement which is very important in WDM systems with narrow channel spacing, also known as Dense Wavelength Division Multiplexing (DWDM), an external wavelength meter has to be used. For all these setups an additional controller plus software is needed for synchronizing and data capturing.

JP-A-06 140717, Lewis L. L. in "Low noise laser for optically pumped cesium standards" (proceedings of the annual frequency control symposium, Denver, May 31–Jun. 2, 1989, no. Symp. 43, May 31, 1989, Institute of electrical and electronics engineers, pages 151–157, XP000089353), and Boshier M. G. et al. in "External-Cavity frequency stabilization of visible and infrared semiconductor lasers for high resolution spectroscopy" (Optics communications, vol. 85, no. 4, Sept. 15, 1991, pages 355–359, XP000226852) disclose laser systems with a beam splitter provided in the external cavity. FIG. 1 shows in principle a laser source 5 according to those art documents.

A laser gain medium or amplifier 10 provides a first facet 20 which is low reflective and a second facet 30 which is high reflective. The first facet 20 emits a laser beam 50 into an external cavity of the laser source 5. A collimating lens 60 collimates the laser beam 50 to a beam splitter 65 splitting the laser beam 50 into a part 50' and a part 67. The part 50' of the laser beam 50 is directed to an optical grating 70 as a wavelength dependent mirror. The optical grating 70" diffracts the incident beam 50' and a wavelength separated beam 50" is directed back towards the beam splitter 65. The angle of the optical grating 70 with respect to the beam 50" depends on the wavelength to be selected. The optical grating 70 together with the facet 30 of the semiconductor amplifier 10 define the optical resonator of the laser source 5. The beam splitter 65 splits up the returning beam 50" into a beam 50"' towards the gain medium 10 and a beam 80. The laser system 5 provides as output signals the laser beams 67 and 80, coupled out respectively from the beam splitter 65. The output beam 80 can be coupled into a fiber 90, e.g., by means of an optical lens 100.

Jeffrey Bernstein et al. in "Oscillator design improves dye-laser performance" (Laser Focus World, September 1995, pages 117 ff.) discloses that the laser beam 80, which is substantially coupled out directly after wavelength selection by the optical grating 70 provides an improved lower signal-to-noise ratio output with respect to the output beam 67.

In modem laser applications, in particular for measuring purposes e.g. for measuring modem optical components for DWDM, it becomes increasingly important to provide flexible laser systems offering a wide range of laser signals from high power signals to low noise signals. Although the output.67, coupled out directly the gain medium 10 in the laser system 5 of FIG. 1, provides a possibility for a higher power output with regard to the output 80, the output 67 finds a power limitation in the beam splitter 65. Since the beam splitter 65 couples out as well the beam 80 as the beam 67 necessarily with the same coupling-out-ratio, or in other words, since the beam splitter 65 couples out the power of beam 67 or 80, a certain tradeoff between the possible power to be coupled out and the resonator conditions for an efficient power amplification by the external cavity has to be found. This, however, limits the possible applications of the laser systems and generally renders them to be not sufficiently flexible.

SUMMARY OF THE INVENTION

It is thus an object of the present invention to provide a flexible laser system offering a wide range of laser signals from in particular high power signals to low noise signals. It is a further object to provide a low cost and smaller flexible laser system. This object is solved by independent claims 1 or 2. It is another object to provide a low cost measuring setup for determining high transmission dynamics characteristics. This object is solved by independent claim 8. Preferred embodiments are shown by the dependent claims.

The invention is based on a laser source with an optical resonator. The laser source comprises a laser gain medium, e.g. a semiconductor and/or fiber amplifier, for emitting a laser beam, a wavelength dependent mirror for receiving the laser beam and reflecting back a wavelength separated laser beam, and a beam splitter for dividing the wavelength separated laser beam into a feedback beam directed toward the semiconductor amplifier and an output beam to be coupled out of the optical resonator of the laser source, preferably into an optical fiber.

According to a first aspect of the invention, the laser gain medium comprises a second facet that is partly reflective, so that the second facet emits a second output beam of the laser source, which is preferably coupled into a second optical fiber. The second output beam provides a significantly higher output power than the beam 67 as depicted in FIG. 1, since it is coupled out directly from the gain medium. Additionally, it has been shown that the second output beam provides an improved signal-to-noise ratio with respect to the beam 67, in particular when the gain medium comes to a saturation condition/state. Further more, the second output beam is only influenced by the second facet and not by any other component such as the beam splitter or the like. This leads to an improved radiating characteristic, in particular for the radiation angle and diameter, and allows avoiding interference effects. The second output thus allows a simpler adjustment of a high power beam due to the overall stability of that output, in particular with respect to the beam 67.

The laser system according to the first aspect of the invention allows to execute measurements requiring, at the same time, laser signals with a high signal-to-noise ratio, e.g. for DWDM components, and high power laser signals, e.g. for measuring (saturation effects on Erbium Doped Fiber Amplifiers (EDFA).

According to a second aspect of the invention, the laser source further comprises a mirror arranged in a way that a beam diffracted by the wavelength dependent mirror is reflected back and again diffracted by the wavelength dependent mirror, so that the twice diffracted beam provides the wavelength separated laser beam. Preferably, the mirror is arranged in a Littman-configuration. The additional mirror leads to an improved signal-to-noise ratio and wavelength selectivity, as well for the first as for the second output beam (at the second facet). In particular for the output beam 80, the signal-to-noise ratio can be significantly increased with respect to embodiment as shown in FIG. 1. Furthermore, the additional mirror, in particular when applied in a Littman-configuration, allows providing a continuous and mode-hop free wavelength tuning of the laser source. This is in particular necessary for characterizing optical fiber gratings without requiring high sophisticated measurement setups. Thus, the invention provides a low cost but high quality measurement with respect to solutions requiring expensive wavelength separation or filtering setups.

It is to be understood that, though the first and second aspects of the invention each leads to a significant improvement of the laser system of FIG. 1, both aspects in combination dramatically improve the performance as well of the first as of the second output beam. The first aspect improves the usability of the laser source and renders it possible to provide a wide power range for a plurality of different applications. The second aspect in addition to the first aspect significantly improves the signal-to-noise ratios of the first and second output beams, so that the laser source provides laser signals in a wide power range with improved signal-to-noise ratio.

In a preferred embodiment, the output beam(s) of the laser source is/are preferably coupled into optical fibers, preferably by means of an optical lens and a fixture to align the optical fiber to the optical lens in dependence of the output beam, An optical isolator can be additionally employed for avoiding disturbances of the semiconductor amplifier from any signal outside of the laser source.

The laser source according to the invention is preferably applied in an apparatus for measuring an optical device. The laser source is coupled to and controlled by a wavemeter. The optical device receives an output signal from the laser source and one or more output signals thereof are coupled to one or more power meters. This apparatus provides a low cost measuring setup that allows determining high transmission dynamics characteristics. To enable fast and high accurate measurements, all the components are preferably controlled by one electrical hardware and software structure (e.g., firmware as well as application software, sweep operation). The measurement system provides high reliable and accurate measurement results, shorter measurement times, and is easy to use in particular in an integrated system.

BRIEF DESCRIPTION OF THE DRAWINGS

Other objects and many of the attendant advantages of the present invention will be readily appreciated and become better understood by reference to the following detailed description when considering in connection with the accompanied drawings. Features that are or can be built up substantially equally or similarly are referred to with the same reference sign.

DETAILED DESCRIPTION OF THE INVENTION

Figure 1:
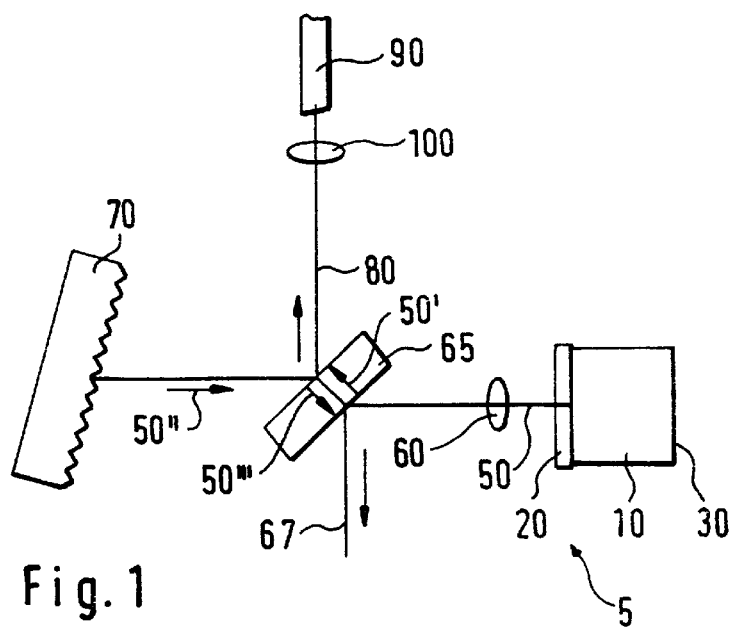
FIG. 1 shows a state of the art laser source.
Figure 2:
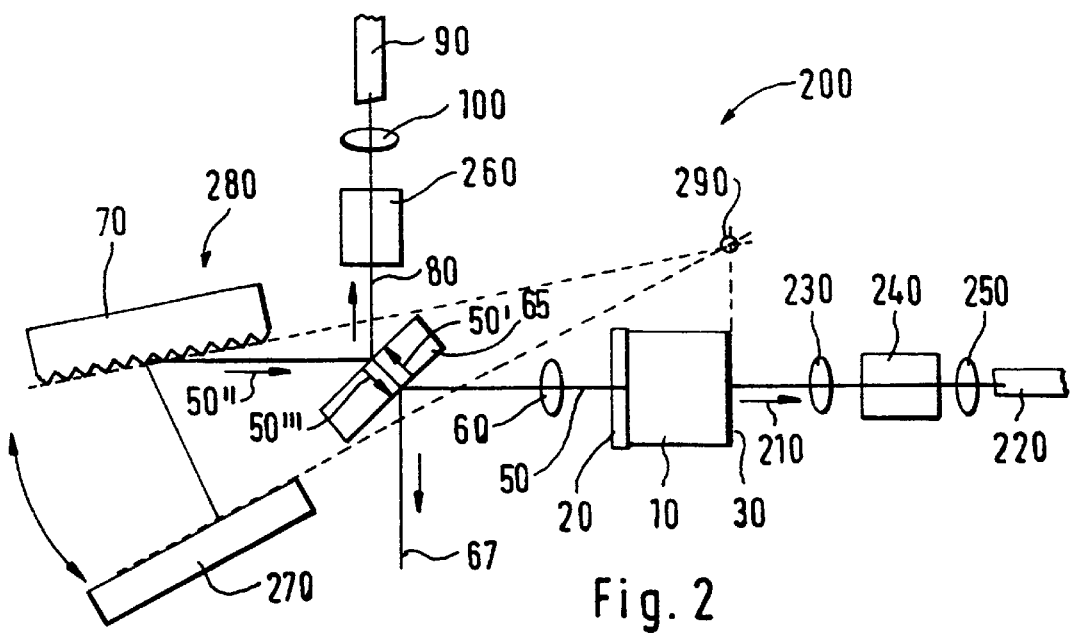
FIG. 2 shows a laser source according to the invention.

FIG. 2 depicts a laser source 200 according to the invention, which can comprise the same features as the laser source 5 of FIG. 1. However, as a first improvement with respect to the laser source 5, the second facet 30 of the laser gain medium 10 in the laser source 200 is provided to be partly (and preferably high) reflective, so that the second facet 30 emits an output beam 210 outside of the external cavity of the laser source 200. In a preferred embodiment, the output beam 210 is coupled into a second optical fiber 220, such as a single mode fiber, preferably by applying a collimating lens 230, an optical isolator 240 for avoiding disturbances of the amplifier 10 from any signal outside of the laser source 200, and a further collimating lens 250. Other means as known in the art for coupling out the output beam 210 might be applied accordingly, dependent on the specific application.

Extracting the output laser beam 210 directly behind the amplifier 10 allows generating a laser signal with a significantly higher signal power, in particular with respect to the output beam 80 and the beam 67. However, it is to be understood, that passing the gain medium 10 on one hand increases the power of the beam, on the other hand also decreases the signal-to noise ratio due to additional source spontaneous emission (SSE). Although the signal-to-noise ratio of the high power output laser beam 210 is lower compared with output beam 80, it is still exhibits an improved signal-to-noise ratio over the beam 67.

In a preferred embodiment, only the beams 80 and 210 will be provided as output beams of the laser source 200, while the beam 67 remains unused and/or is applied for monitoring the laser beam 50.

The beam splitter 65 is preferably optimized for extracting optical power for the output beam 80 without significantly reducing the optical feedback of the external cavity. In a preferred embodiment, the reflectivity of the beam splitter 65 is selected to be approximately ¹⁄₁₀, i.e. ¹⁄₁₀ of the incident beam is reflected either as beam 67 or 80. The beam splitter 65 can be embodied by a simple glass plate, whereby one side has a partly reflecting coating and the other side has an anti-reflective coating. To avoid, in addition, internal interference effects the two sides (faces) are preferably tilted regarding to each other.

Figure 3:
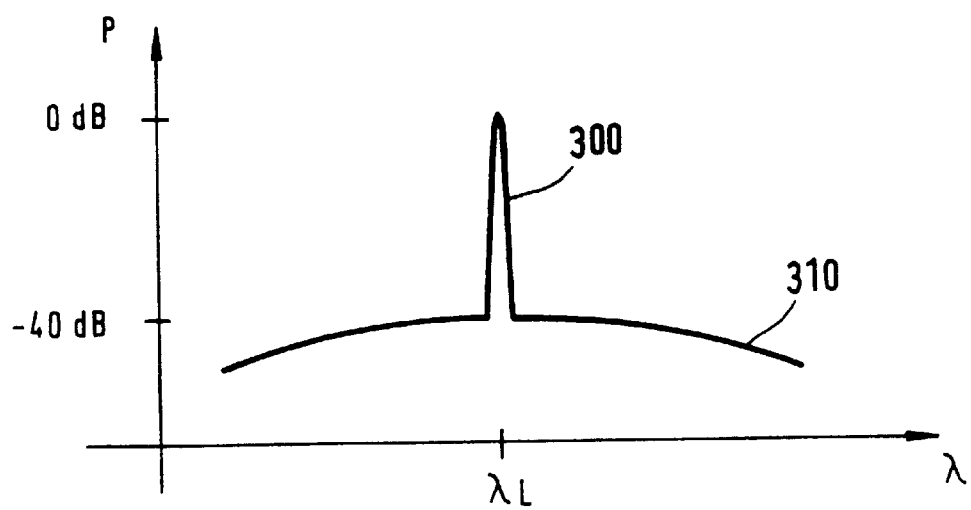
FIGS. 3 and 4 show representative spectra of output beams of the laser source of FIG. 2.

FIG. 3 shows a spectrum of a representative output beam 210, wherein the x-axis depicts the wavelengths and the y-axis depicts the power density of the output beam 30. The spectrum exhibits a signal peak 300 at a laser wavelength $\ddot{e}_L$ and a background noise 310 provided by the called Source Spontaneous Emission (SSE) or Amplified Spontaneous Emission (ASE). In most applications of semiconductor lasers, the signal peak 300 exhibits a signal to noise ratio of about 20 dB as depicted in FIG. 3a.

As another improvement over the laser source 5 in FIG. 1, the output beam 80 is preferably coupled into the fiber 90 via a fixture (not shown in FIG. 2) to align the fiber 90 to the optical lens 100 in dependence of the output beam 80 and an optical isolator 260 for avoiding disturbances of the amplifier 10 from any signal outside of the laser source 200.

As a further improvement over the laser source 5 of FIG. 1, either in addition to the provision of the output beam 210 or independent thereof, the laser source 200 of FIG. 2 further provides a mirror 270, which can be e.g. a plane or curved (preferably concave or convex) mirror or a dihedral element. The mirror 270 in conjunction with the optical grating 70 provides an improved wavelength dependent mirror 280 over the application of the optical grating 70 as depicted in FIG. 1.

The mirror 270 is arranged in a way that the part of the beam 50' reaching the grating 70 is diffracted by the grating 70 to the mirror 270. The mirror 270 reflects back the diffracted and thus wavelength filtered beam to the grating 70, which again diffracts the incoming beam from the mirror 270 towards the beam splitter 65. The twice-diffracted beam provides the wavelength separated laser beam 50".

Preferably, the mirror 270 is arranged in a Littman-configuration allowing a mode-hop free wavelength tuning of the laser source 200. In the Littman-configuration, as known in the art, planes through the grating 70, the mirror 270, and the facet 30 substantially intersect in a point 290.

Figure 4:
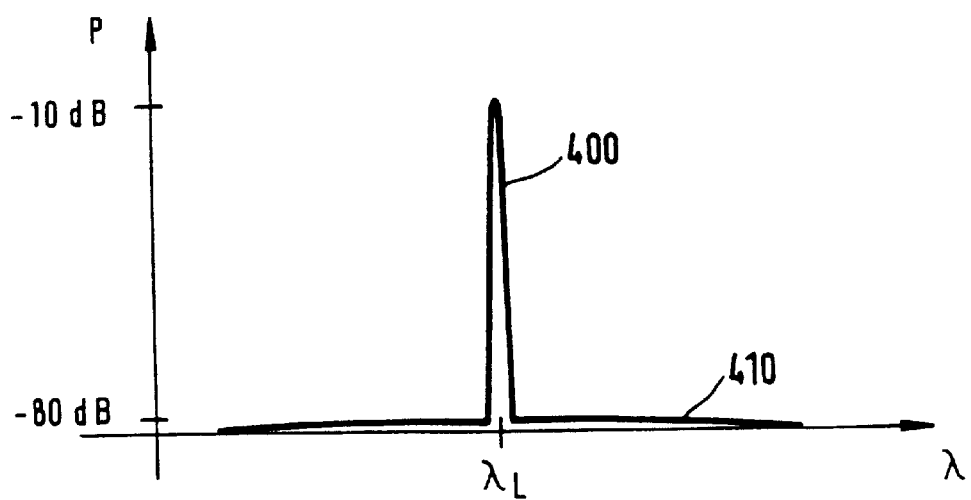

FIG. 4 shows a spectrum of a representative output beam 80, wherein the x-axis depicts the wavelengths and the y-axis depicts the power of the output beam 80. In accordance with the spectrum of FIG. 3, the output beam 210 exhibits a signal peak 400 at the laser wavelength $\ddot{e}_L$ and a background noise 410. However, the signal peak 400 exhibits an improved signal-to-noise ratio with respect to the signal peak 300 of the spectrum in the output beam 210 in FIG. 2. The signal-to-noise ratio of the signal peak 400, in an application of semiconductor lasers according to the invention, is greater than 70 dB, which gives an integral total noise ratio of about 50 dB. On the other hand, the amplitude of the signal peak 400 is reduced in comparison to the signal peak 300 of the output beam 30. FIG. 4 exemplarily depicts a relative value of −10 dB for the amplitude of output beam 210 with respect to the relative value of 0 dB for the amplitude of output beam 210 in FIG. 3.

The laser source 200 according to the invention thus provides a high purity output signal 80, which can either be the only output thereof, or represent a high purity but low power output with respect to the further output signal 210, which may be applied in combination with the output signal 80.

Figure 5:
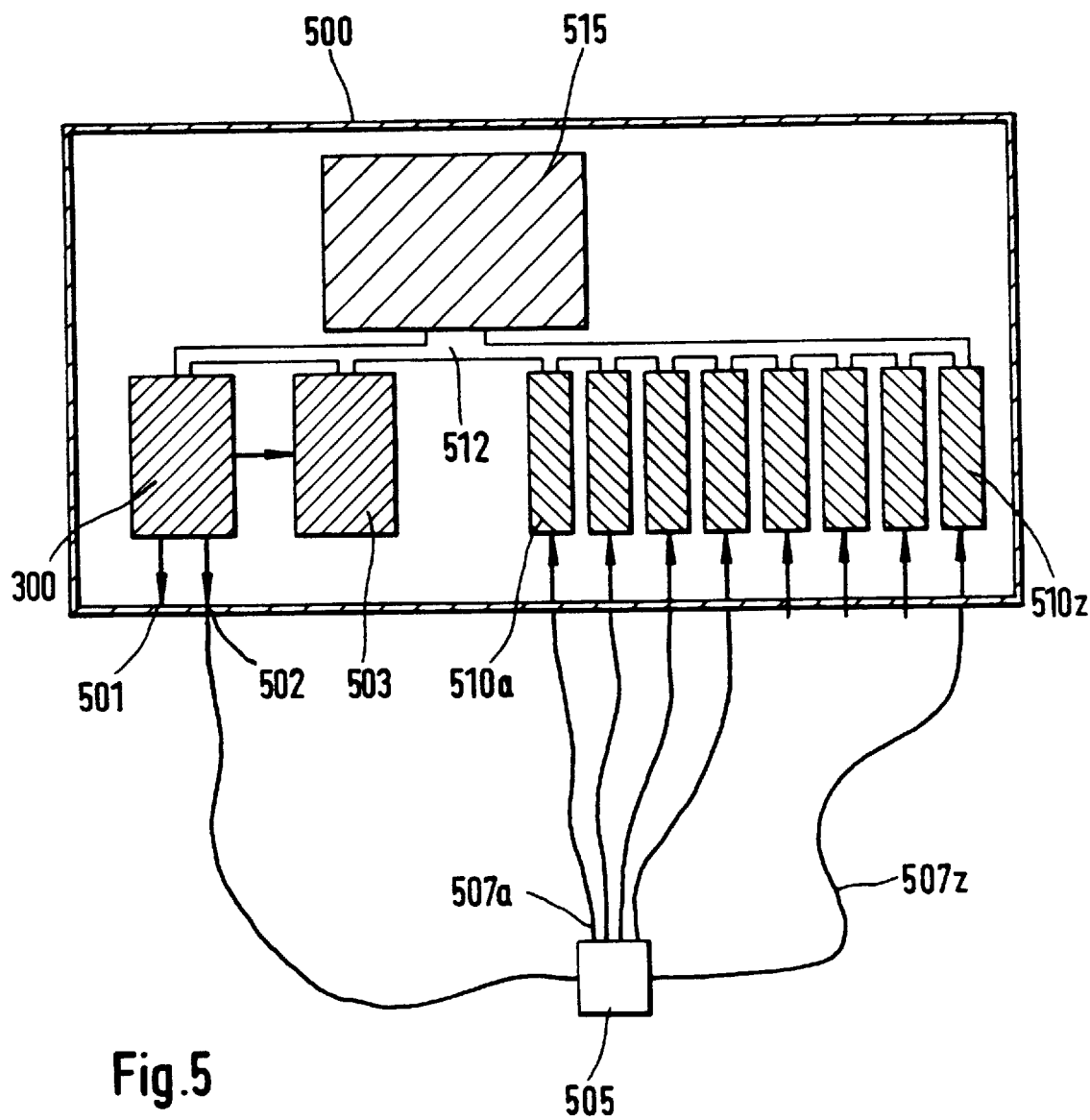
FIG. 5 depicts a preferred application of the laser source according to the invention is in an arrangement for measuring optical devices or components.

A preferred application of the laser source 200 according to the invention is in an arrangement 500 for measuring optical devices or components as depicted in FIG. 5. The laser source 200 provides at an output 501 the output signal 210 and at an output 502 the high purity output signal 80. The laser source 200 is coupled to and controlled by a wavemeter 503, which is preferably embodied according to a wavemeter as described in the European patent application 97107247.5 by the same applicant A device under test (DUT) 505 receives the output signals either from output 501 or 502 of the laser source 200, e.g., via an optical single mode fiber (SMF).

Dependent on the characteristics of the DUT 505, the DUT 505 might provide a plurality of output signals 507a . . . 507z, which can be respectively coupled (e.g., via SMFs) to one or more power meters 510a . . . 510z. The laser source 200, the wavemeter 503, and the power meters 510a . . . 510z can be connected via an internal data bus 512 to a main controller unit 515 for data capturing and analyzing. In a preferred embodiment a common triggering system is used to read the wavelength of the laser source 200 and also the power values measured by the power meter 510a . . . 510z simultaneously. Therefore, high accurate wavelength measurements are possible without a need for long measurement times.

Figure 6:
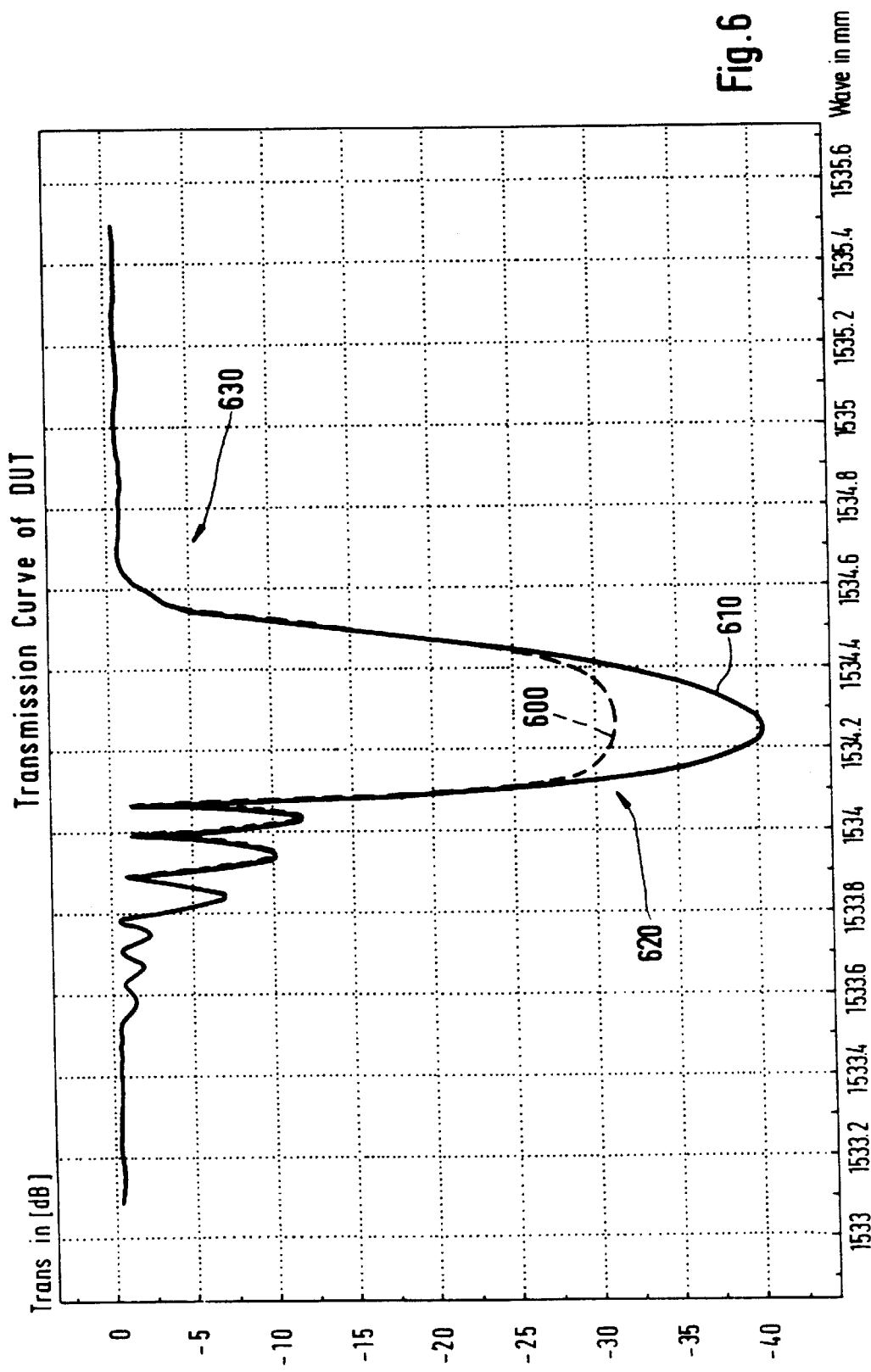
FIG. 6 shows a measurement plot for an example of a notch filter as DUT in the arrangement of FIG. 5.

FIG. 6 shows a measurement plot for an example of a notch filter as the OUT 505 with four output ports for dropping all signals 507a . . . 507y and one port for transmitting the remaining signal on the output 507z. An important parameter to measure is the suppression of the signal at the filter wavelength of the signals 507a . . . 507y. A dashed line 610 indicates the measurement result by using the high power output 501 from the laser source 200 as the input signal for the DUT 505. A line 610 indicates the measurement by using the low noise output port 502 from the laser source 200. It is apparent by comparing the curves 600 and 610, that the influence of the background noise 310 and 410 (cf. FIGS. 3 and 4) is in particular dominant in an area of higher attenuation 630 of the DUT 505. In an area of lower attenuation 630, the curves 600 and 610 substantially match. Thus, by choosing the low noise output port 502 for measuring the area of higher attenuation 630 significantly improves the measuring result.

The optical output power coupled into the optical fiber 90 and/or the optical fiber 220 is preferably stabilized independently and adjusted by means of one or two individual receiving elements and the corresponding electronic circuits.

What is claimed is:

1. A laser source with an optical resonator comprising:
   a laser gain medium with a first facet that is low reflective for emitting a laser beam within the optical resonator,
   a wavelength dependent mirror for receiving at least a portion of the laser beam, and reflecting back a wavelength separated laser beam,
   a beam splitter for dividing the wavelength separated laser beam into a feedback beam directed toward the laser gain medium and a first output beam to be coupled out of the optical resonator of the laser source, wherein the laser gain medium comprises a second facet which is partly reflective, so that the second facet emits a second output beam of the laser source.

2. The laser source of claim 1, further comprising:
a second mirror arranged in a way that a beam diffracted by the wavelength dependent mirror is reflected back and again diffracted by the wavelength dependent mirror, so that the twice diffracted beam provides the wavelength separated laser beam, whereby the mirror is arranged in a Littman-configuration.

3. The laser source according to claim 1, wherein the second output beam of the laser source is coupled into a second optical fiber.

4. The laser source of claim 1, wherein the beam splitter is optimized for extracting optical power for the first output beam without significantly reducing the feedback beam.

5. The laser source of claim 1, wherein the beam splitter is a glass plate comprising one side with a partly reflecting coating and another side with an anti-reflective coating, whereby the two sides are tilted regarding to each other.

6. The laser source of claim 1, wherein at least one of the first output beam and the second output beam is coupled into a first optical fiber by means of an optical lens, and a fixture to align the first optical fiber to the optical lens in dependence of the first output beam.

7. The laser source of claim 6, wherein at least one of the first output beam and the second output beam is coupled into a first optical fiber by means of an optical isolator for avoiding disturbances of the laser gain medium from a signal outside of the laser source.

8. An apparatus for measuring an optical device comprising:
a laser source with an optical resonator comprising:
a laser gain medium with a first facet that is low reflective for emitting a laser beam within the optical resonator;
a wavelength dependent mirror for receiving the laser beam, or parts of it, and reflecting back a wavelength separated laser beam; and
a beam splitter for dividing the wavelength separated laser beam into a feedback beam directed toward the laser gain medium and a first output beam to be coupled out of the optical resonator of the laser source,
wherein the laser gain medium comprises a second facet which is partly reflective, so that the second facet emits a second output beam of the laser source, which is preferably coupled into a second optical fiber;
said apparatus for measuring an optical device further comprising a wavemeter, coupled to and controlling said laser source; and
one or more power meters coupled to at least one output of said optical device, wherein said first output beam is coupled to at least one input of said optical device.

9. The apparatus of claim 8, further comprising a main controller unit for data capturing and analyzing which is coupled to the laser source, the wavemeter, and the one or more power meters by a data bus.

10. The apparatus of claim 8, further comprising a triggering system for simultaneously reading the wavelength of the laser source and power values measured by the one or more power meters.

11. The laser source of claim 1, wherein the beam splitter is optimized for extracting optical power for the first output beam without significantly reducing the feedback beam.

12. The laser source of claim 1, wherein the beam splitter is a glass plate comprising one side with a partly reflecting coating and another side with an anti-reflective coating, whereby the two sides are tilted regarding to each other.

13. The laser source of claim 1, wherein at least one of the first output beam and the second output beam is coupled into a first optical fiber by means of an optical lens, and a fixture to align the first optical fiber to the optical lens in dependence of the first output beam.

14. The laser source of claim 13, wherein at least one of the first output beam and the second output beam is coupled into a first optical fiber by means of an optical isolator for avoiding disturbances of the laser gain medium from a signal outside of the laser source.

15. An apparatus for measuring an optical device comprising:
a laser source with an optical resonator comprising:
a laser gain medium with a first facet that is low reflective for emitting a laser beam within the optical resonator;
a wavelength dependent mirror for receiving the laser beam, or parts of it, and reflecting back a wavelength separated laser beam;
a beam splitter for dividing the wavelength separated laser beam into a feedback beam directed toward the laser gain medium and a first output beam to be coupled out of the optical resonator of the laser source; and
a mirror arranged in a way that a beam diffracted by the wavelength dependent mirror is reflected back and again diffracted by the wavelength dependent mirror, so that the twice diffracted beam provides the wavelength separated laser beam, whereby the mirror is arranged in a Littman-configuration;
said apparatus for measuring an optical device further comprising a wavemeter, coupled to and controlling said laser source; and
one or more power meters coupled to at least one output of said optical device, wherein said first output beam is coupled to at least one input of said optical device.

16. The apparatus of claim 15, further comprising a main controller unit for data capturing and analyzing which is coupled to the laser source, the wavemeter, and the one or more power meters by a data bus.

17. The apparatus of claim 15, further comprising a triggering system for simultaneously reading the wavelength of the laser source and power values measured by the one or more power meters.

* * * * *